(12) United States Patent
Ishikawa et al.

(10) Patent No.: US 7,079,368 B2
(45) Date of Patent: Jul. 18, 2006

(54) ELECTRICAL RESOURCE DEVICE AND LOAD DRIVING DEVICE

(75) Inventors: Fukuo Ishikawa, Kariya (JP); Akira Sugiura, Okazaki (JP); Hirofumi Mokuya, Kariya (JP)

(73) Assignees: Anden Co., LTD, Anjo (JP); Denso Corporation, Kariya (JP)

( * ) Notice: Subject to any disclaimer, the term of this patent is extended or adjusted under 35 U.S.C. 154(b) by 73 days.

(21) Appl. No.: 10/245,367

(22) Filed: Sep. 18, 2002

(65) Prior Publication Data
US 2003/0072120 A1    Apr. 17, 2003

(30) Foreign Application Priority Data
Sep. 28, 2001  (JP) .............................. 2001-302615

(51) Int. Cl.
    *H02H 9/08* (2006.01)
(52) U.S. Cl. ..................................... 361/93.1; 361/93.9
(58) Field of Classification Search .................. 361/18, 361/24, 25, 26, 27–28, 101, 102, 103, 93.1, 361/93.7, 93.8, 93.9, 94, 100
    See application file for complete search history.

(56) References Cited

U.S. PATENT DOCUMENTS

| | | | | |
|---|---|---|---|---|
| 5,375,029 A | * | 12/1994 | Fukunaga et al. | 361/101 |
| 5,694,305 A | * | 12/1997 | King et al. | 363/21.11 |
| 5,894,394 A | * | 4/1999 | Baba et al. | 361/87 |
| 5,898,557 A | * | 4/1999 | Baba et al. | 361/103 |
| 6,205,010 B1 | | 3/2001 | Ohsaka et al. | |
| 6,320,275 B1 | | 11/2001 | Okamoto et al. | |
| 6,452,766 B1 | * | 9/2002 | Carper | 361/18 |
| 6,717,785 B1 | * | 4/2004 | Fukuda et al. | 361/93.1 |

FOREIGN PATENT DOCUMENTS

| | | |
|---|---|---|
| JP | A-10-145205 | 5/1998 |
| JP | A-H10-285784 | 10/1998 |
| JP | A-10-336886 | 12/1998 |
| JP | A-11-136846 | 5/1999 |
| JP | A-2000-23346 | 1/2000 |
| JP | A-2000-244294 | 9/2000 |
| JP | A-2001-160746 | 6/2001 |
| JP | A-2001-160747 | 6/2001 |

* cited by examiner

*Primary Examiner*—Brian Sircus
*Assistant Examiner*—Danny Nguyen
(74) *Attorney, Agent, or Firm*—Posz Law Group, PLC

(57) ABSTRACT

An electrical resource device of the present invention includes a current restriction portion for restricting current flowing in a semiconductor element based on a predetermined overcurrent restriction threshold by controlling the semiconductor element when the current detected by a current detecting portion exceeds the predetermined overcurrent restriction threshold. The predetermined overcurrent restriction threshold is defined based on a relationship between time and a change of a destruction current amount by which wiring may be destroyed, and is determined to be under the destruction current. Therefore, it is possible to prevent the wiring from being destroyed.

19 Claims, 11 Drawing Sheets

ELECTRICAL RESOURCE DEVICE AND LOAD DRIVING DEVICE

CROSS REFERENCE TO RELATED APPLICATION

This application is based upon and claims the benefit of Japanese Patent Application No. 2001-302615 filed on Sep. 28, 2001, the contents of which are incorporated herein by reference.

1. Field of the Invention

The present invention relates to an electrical resource device and a load driving device that protect against wiring destruction or semiconductor device destruction caused by an overcurrent.

2. Background of the Invention

A load driving device that protects a semiconductor device for driving a load when an overcurrent flows into the load is proposed. For example, JP-A-10-145205 discloses a typically load driving device that detects an overcurrent based on a temperature increase of a semiconductor device for driving a load and stops the load driving before the semiconductor device is damaged to protect the semiconductor device.

However, in the load driving device mentioned above, the overcurrent flows into the load through wiring before the temperature of the semiconductor device increases to a predetermined value. As a result, it is impossible to protect wiring from the overcurrent if the semiconductor device temperature is not above the predetermined temperature.

SUMMARY OF THE INVENTION

It is therefore an object of the present invention to provide an electrical resource device and a load driving device that are capable of obviating the above problems.

It is another object of the present invention to provide an electrical resource device and a load driving device that are capable of protecting wiring from an overcurrent.

According to an electrical resource device of the present invention, a current restriction portion restricts current, which flows in a semiconductor element, to a level below a predetermined overcurrent restriction threshold by controlling the semiconductor element when the current detected by a current detecting portion exceeds the predetermined overcurrent restriction threshold. The predetermined overcurrent restriction threshold is defined based on a relationship between time and a change in a destruction current amount by which wiring may be destroyed, and is determined under the destruction current. Therefore, it is possible to prevent the wiring from being destroyed.

It is preferable that the electrical resource device of the present invention includes an output block portion for stopping operation of the semiconductor element when the current restriction executed by the current restriction portion operates for more than a first predetermined time (T1). Thus, it is further possible to prevent wiring from being destroyed.

BRIEF DESCRIPTION OF THE DRAWINGS

Other objects, features and advantages of the present invention will be understood more fully from the following detailed description made with reference to the accompanying drawings. In the drawings.

DETAILED DESCRIPTION OF THE PREFERRED EMBODIMENT

Figure 1:
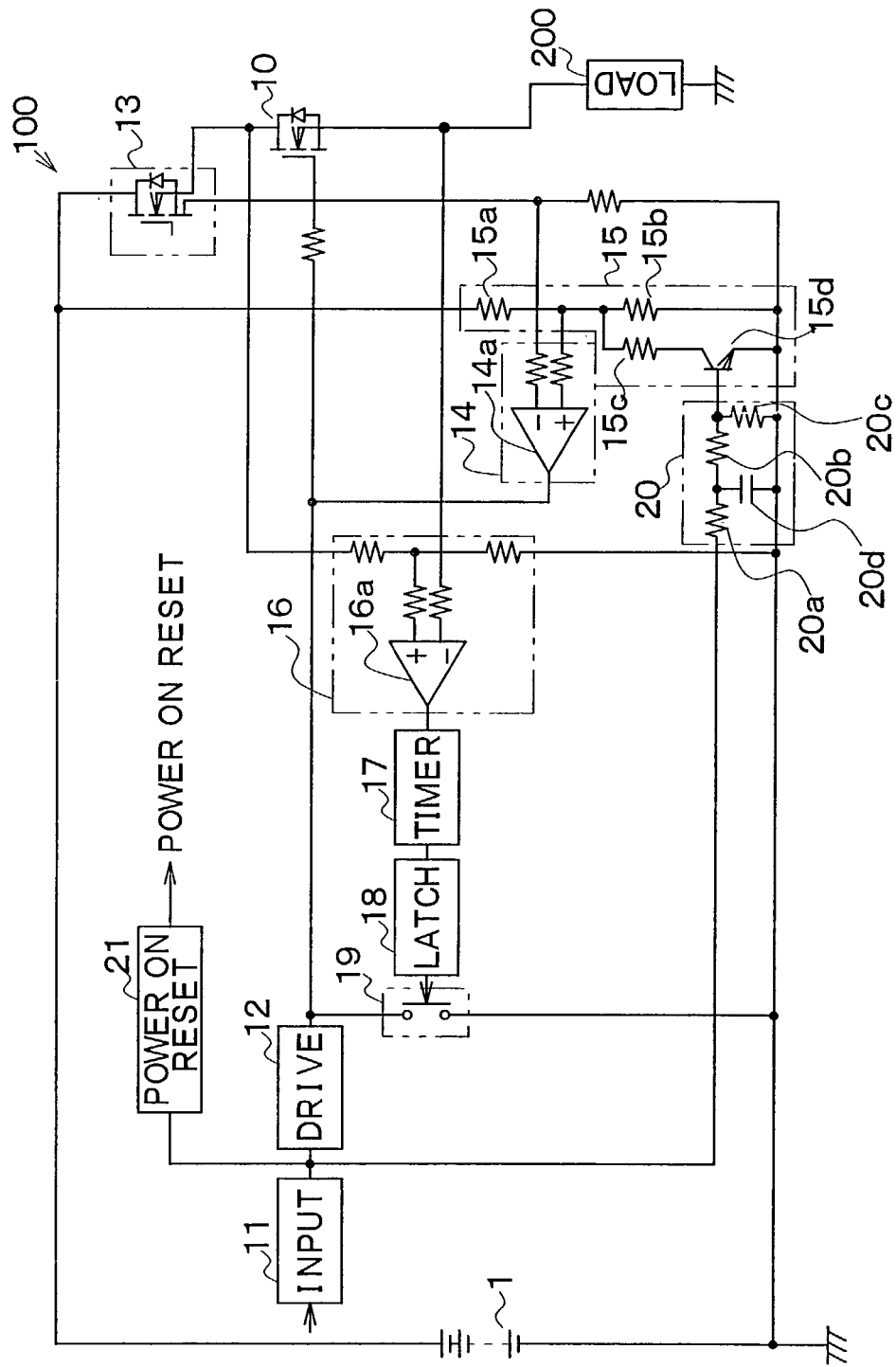
FIG. 1 shows a schematic view of a load driving device according to a first embodiment of the present invention.

The present invention will be described further with reference to various embodiments shown in the drawings.

First Embodiment

Referring to FIG. 1, a load driving device 100 is installed in a vehicle for use as an electrical resource device. The load driving device 100 is connected to a battery 1 to supply a load current to a load 200 (for example, a lamp, a motor, a resistor such as a heater, a solenoid or the like) via wiring to drive the load 200. The load driving device 100 includes a semiconductor device 10, an input circuit 11, and a driver circuit 12. The semiconductor device 10 acts as a switching element for controlling the load current supply to the load 200. A power MOSFET, an IGBT, a bipolar transistor or the like is used for the semiconductor device 10. The input circuit 11 receives signals from sensors or the like (not shown) and outputs a signal to the driver circuit 12. The driver circuit 12 makes the semiconductor device 10 turn on or off based on the output signal from the input circuit 11.

The load device 100 also includes a current mirror circuit 13, a current restriction circuit 14, a threshold determination circuit 15, a current restriction detecting circuit 16, a timer 17, a latch circuit 18, a switch 19, a delay circuit 20, and a power on reset circuit 21.

The current mirror circuit 13 detects the load current flowing to the semiconductor device 10 (i.e., a current flowing through the wiring). The current restriction circuit 14 detects whether the load current is larger than an overcurrent restriction threshold based on the load current detected by the current mirror circuit 13, and restricts the amount of current flowing to the semiconductor device 10. The threshold determination circuit 15 determines the overcurrent restriction threshold. The current restriction detecting circuit 16 detects whether the current amount to the semiconductor device 10 is restricted. The timer 17 counts a time since the current is restricted. The latch circuit 18 maintains an output of the timer circuit 17 when the time counted by the timer 17 reaches predetermined time T1. The switch 19 stops operation of the semiconductor device 10 based on the output from the latch circuit 18. The delay circuit 20 outputs a delay signal to change the overcurrent restriction threshold determined by the threshold determination circuit 15 when a predetermined time T2 passes after the load is driven. The power on reset circuit 21 resets the timer circuit 17 and the latch circuit 18 when a load driving is initiated.

According to the load driving device 100, when the input circuit 11 inputs a signal for executing the load driving, the driver circuit 12 turns on the semiconductor device 10 to supply the load current to the load 200 via the wiring. The power on reset circuit 21 simultaneously powers and resets the timer circuit 17 and the latch circuit 18.

With the load current supplied to the semiconductor device 10, a current in proportion to the load current, e.g., one two-thousandth of the load current flows to the current mirror circuit 13. Also, a voltage in proportion to the load current is applied to a non-inverting input terminal of the comparator 14a of the current restriction circuit 14. On the other hand, a threshold voltage corresponding to a threshold for detecting the overcurrent has been already applied an inverting input terminal of the comparator 14a.

Accordingly, because the voltage in proportion to the load current is smaller than the threshold voltage until the load current exceeds the overcurrent restriction threshold, the comparator 14a outputs a high level signal and therefore the semiconductor device 10 is continuously driven.

However, when overcurrent caused by such as a dead short circuit of the load or the wiring flows through the semiconductor device 10, the voltage in proportion to the load current exceeds the threshold voltage. Therefore, the comparator 14a generates a decreased current for driving the semiconductor device 10 decrease. The load current also decreases. As a result, the voltage in proportion to the load current is smaller than the threshold voltage, and the comparator 14a increases the current for driving the semiconductor device 10. In this way, a feedback operation is repeatedly executed to restrict the load current to a level below the overcurrent restriction threshold.

Figure 2:
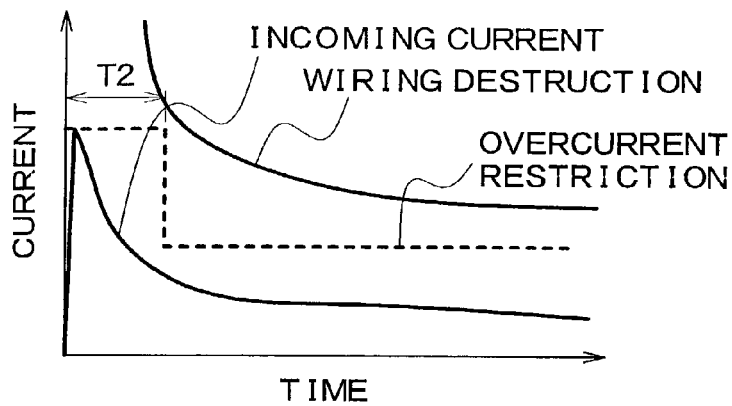
FIG. 2 is a graph showing a threshold for restricting an overcurrent formed between a load current feature and wiring destruction feature with respect to time according to the first embodiment.

The overcurrent restriction threshold for detecting the overcurrent and restricting the load current is determined as follows. The load current changes as shown in FIG. 2 after the load driving starts. The load current is a large incoming current until a predetermined time T2 passes after the load driving starts, and then gradually decreases to a stationary current. A wiring destruction feature of wiring used for the load driving device 100 (i.e., a relationship between time and a change of destruction current amount by which the wiring may be destroyed) is relatively large when the load driving starts and then gradually decreases as time goes on. Since the current amount that may destroy the wiring is defined based on wiring parameters such as, for example, a diameter or a material of the wiring, the overcurrent restriction threshold is determined to be less than the current that may destroy the wiring but greater than the stationary current. Specifically, in the present embodiment, a first threshold is determined to prevent the comparator 14a from improper operation caused by the incoming current within the predetermined time T2 after the load driving starts. A second threshold, which is lower than the first threshold, is then determined. Incidentally, it is preferable that the overcurrent restriction threshold is determined to an appropriate value based on the load, the diameter of the wiring and environment.

The threshold determination circuit 15 outputs a first threshold voltage as the first threshold within the predetermined time T2 after the load driving starts. Then, the delay circuit 20 outputs a delay signal when the predetermined time T2 passes, and therefore the threshold determination circuit 15 outputs a second threshold voltage as the second threshold. Specifically, referring to FIG. 1, the threshold determination circuit 15 includes resistors 15a, 15b and 15c and a transistor 15d. The threshold determination circuit 15 outputs the first threshold voltage based on the resisters 15a, 15b when the transistor 15d is OFF because the delay signal is not output from the delay circuit 20, and outputs the second threshold voltage based on the resisters 15a–15c when the transistor 15d is ON because the delay signal is not output from the delay circuit 20. Incidentally, the delay circuit 20 includes resisters 20a, 20b and 20c and a capacitance 20d, and outputs the delay signal (timer signal) when the predetermined time T2 has passed after the load driving starts.

Upon the current restriction, the current restriction detecting circuit 16 outputs a current restriction detecting signal. The current restriction detecting circuit 16 includes a comparator 16a for observing a voltage between a source and drain of the semiconductor device 10. The comparator 16a outputs the current restriction detecting signal when the voltage between the source and drain of the semiconductor device 10 increases because of the current restriction.

The timer circuit 17 is reset before the comparator 16a outputs the current restriction detecting signal, starts a time count with the current restriction detecting signal and outputs an output block signal when a counted time reaches the predetermined time T1.

The latch circuit 18 maintains the output block signal from the timer circuit 17, and the switch 19 stops operation of the semiconductor device 10 based on the output block signal maintained by the latch circuit 18. The switch 19 is formed by, for example, a switching element such as a transistor and blocks an output from the driver circuit 12 to the semiconductor device 10.

According to the load driving device 10 of the present embodiment, the load current is compared to the first threshold in the predetermined time T2 after the load driving starts. If the load current exceeds the first threshold, the current restriction circuit 14 controls the load current to be at a level below the first threshold. In this case, it is possible to prevent the load 200 from being destroyed by the incoming current using an appropriate first threshold that can restrict the incoming current flowing to the load 200. After the predetermined time T2 has passed, the load current is compared to the second threshold. If the load current exceeds the second threshold, the current restriction circuit 14 controls the load current to be at a level below the second threshold.

In this manner, it is possible to prevent the wiring from being destroyed because the first and second thresholds are determined between the load current feature and the wiring destruction feature as shown in FIG. 2. The first threshold is larger than the second threshold, and therefore the incoming current does not improperly cause the current restriction.

Further, if a current restriction time exceeds the predetermined time T1, the switch 19 stops operation of the semiconductor device 10. Therefore, the load 200 is appropriately protected from the overcurrent caused by a dead short circuit.

Figure 3A:
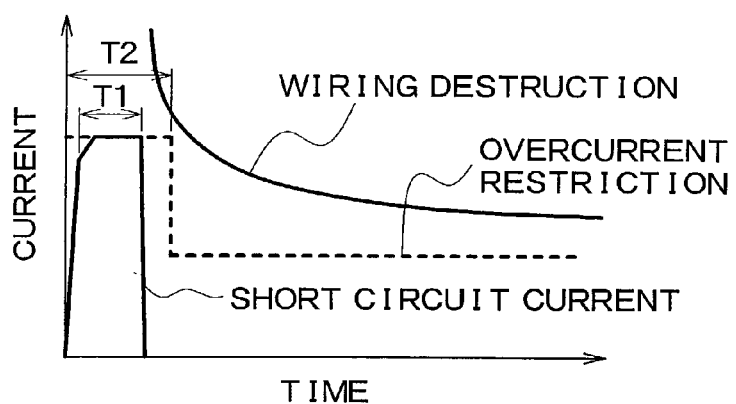
FIGS. 3A and 3B show wave shapes when the load driving device cause a dead short circuit according to the first embodiment.

FIG. 3A shows wave shapes when the dead short circuit is generated before the load driving starts. In this case, the load current is restricted to the first threshold because the load current exceeds the first threshold. Also, the load current is stopped because the current restriction time reaches the predetermined time T1.

Figure 3B:
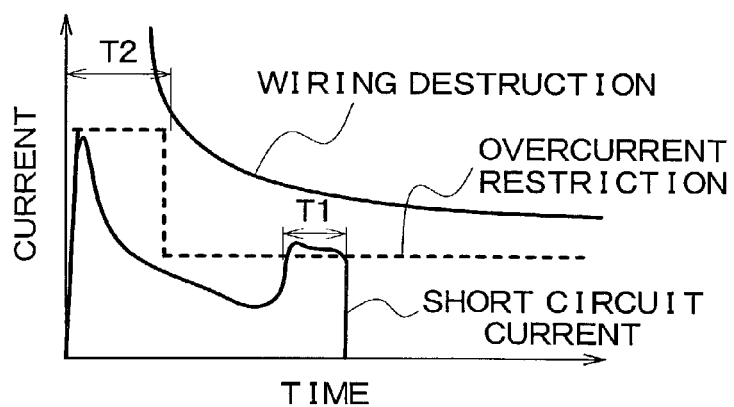

FIG. 3B shows wave shapes when the dead short circuit is generated after the load driving starts. In this case, the load current is restricted to the second threshold when the load current exceeds the second threshold. Also, the load current is stopped when the current restriction time reaches the predetermined time T1.

Second Embodiment

Figure 4:
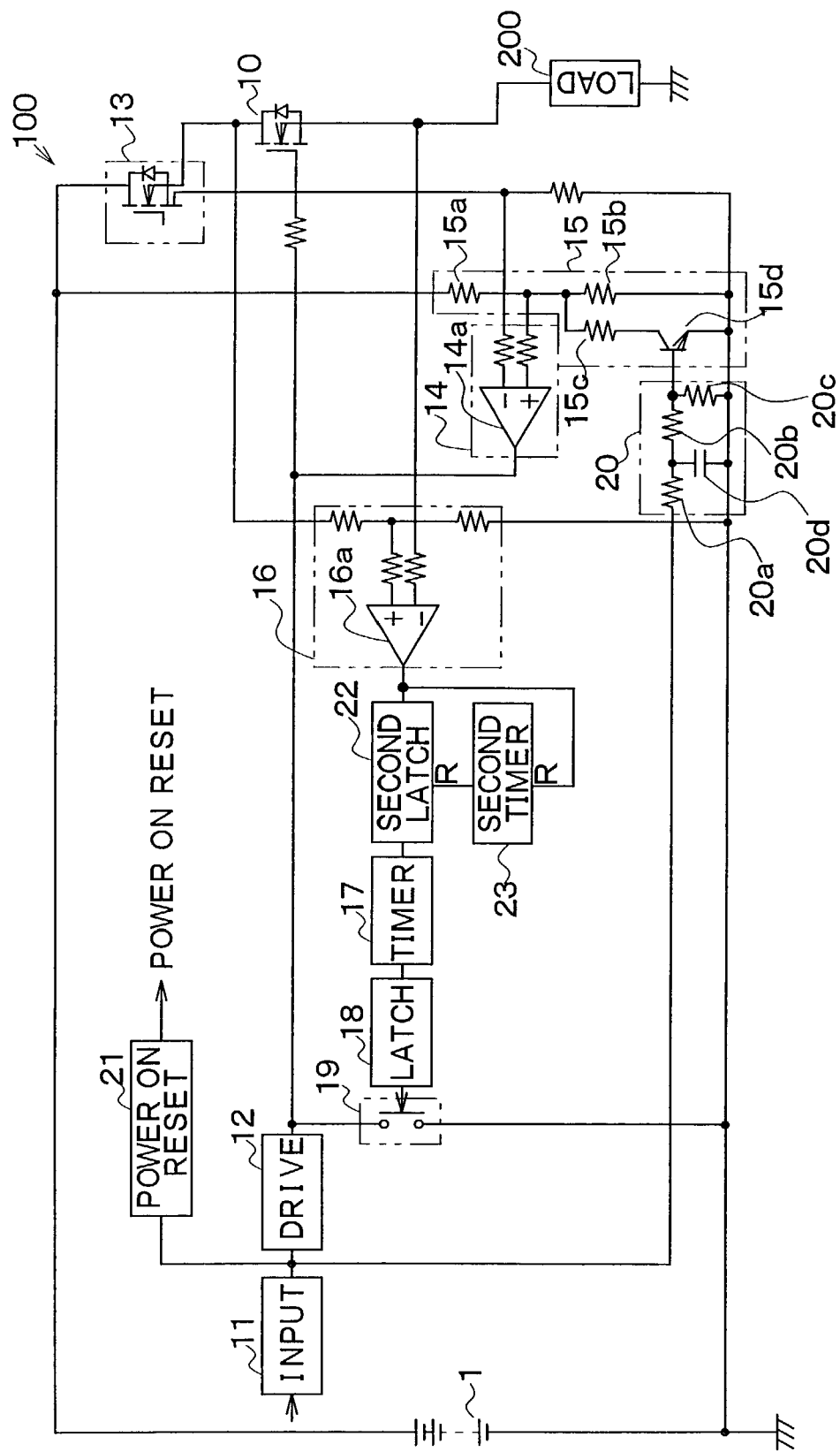
FIG. 4 shows a schematic view of a load driving device according to a second embodiment of the present invention.
Figure 5:
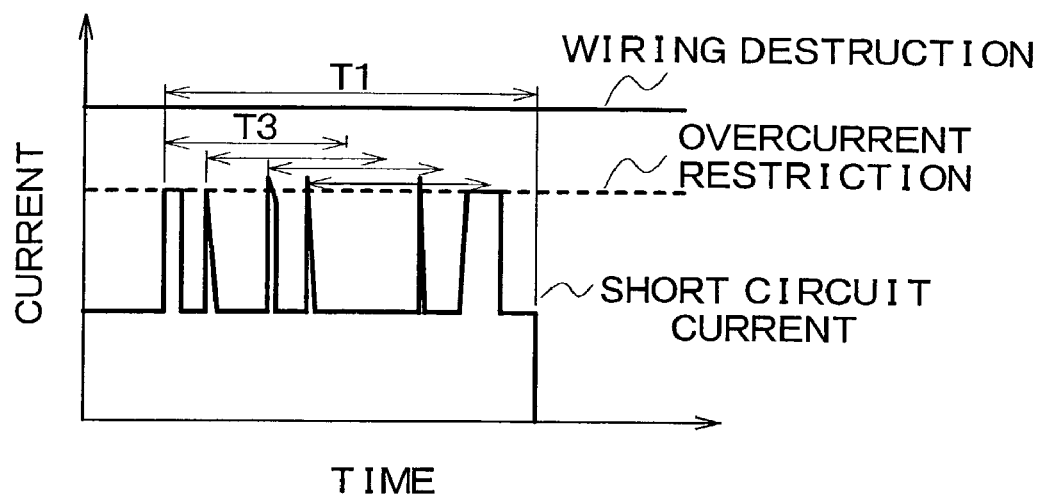
FIG. 5 is a graph of wave shapes when the load driving device causes an intermittent short circuit according to the second embodiment.

A load driving device of the second embodiment of the present invention is described with reference to FIG. 4.

An intermittent short circuit is defined as either a wiring short circuit or a dead circuit. For example, an intermittent short circuit is generated when wiring exposed through the wiring isolation coating intermittently touches a vehicle body due to wiring vibrations. If the intermittent short circuit is generated, since a load current intermittently exceeds an overcurrent restriction threshold, a current restriction detecting circuit 16 intermittently outputs a current restriction detecting signal. Accordingly, when each interval between each current restriction detecting signal is shorter than a predetermined time T1, a timer 17 cannot count the predetermined time T1. Therefore, operation of a semiconductor device 10 is not stopped.

To stop the operation of the semiconductor device 10 when the intermittent short circuit is generated, a second latch circuit 22 and a second timer circuit 23 are added to the load driving device 100 of first embodiment.

The second latch circuit 22 maintains a current restriction detecting signal outputted from the current restriction detecting circuit 16. The second timer 23 is reset by the current restriction detecting signal from the current restriction detecting circuit 16 and resets the second latch circuit 22 if a time that the current restriction detecting signal is not output from the current restriction detecting circuit 16 reaches a predetermined time T3.

The predetermined time T3 is defined to be shorter than the predetermined time T1 counted by the timer circuit 17 and longer than an interval of the current restriction detecting signal. Therefore, if the load current intermittently exceeds the overcurrent restriction threshold caused by the intermittent short circuit and the current restriction detecting circuit 16 repeatedly outputs the current restriction signal whose interval is shorter than the predetermined time T3, the second latch circuit 22 maintains the current restriction detecting signal. Also, the timer circuit 23 is reset by a subsequent current restriction detecting signal output from the current restriction detecting circuit 16 before it counts the predetermined time T3. Therefore, the second latch circuit 22 is not reset. After the second latch circuit 22 maintains the current restriction detecting signal during the predetermined time T1 counted by the timer 17, operation of the semiconductor 10 is stopped in the same manner as in the first embodiment.

If the intermittent short circuit is not repeated during a time longer than the predetermined time T3, the second timer circuit 23 outputs a reset signal to the latch circuit 22. Therefore, the latch circuit 22 stops to output the current restriction detecting signal to the timer circuit 17. In this condition, operation of the semiconductor device 10 is not stopped if the timer 17 has not yet counted the predetermined time T1. That is, if the intermittent short circuit is not repeated over the predetermined time T1 because it is temporally generated, the operation of the semiconductor device 10 is not stopped. As a result, it is possible to prevent the wiring from being destroyed by an intermittent short circuit without improper operation.

According to the load driving device 10 of the second embodiment, the operation of the semiconductor device 10 is stopped when a short circuit is generated when the load 200 is driven by switching the semiconductor device 10 under pulse width modulation (PWM) control as when the intermittent short circuit is generated.

In PWM control, when a signal for executing PWM control is transmitted to the input circuit 11, the semiconductor device 10 is switched by PWM control and the load 200 is therefore driven. Accordingly, the current restriction signal is periodically output when the load current exceeds the overcurrent restriction threshold.

Figure 6:
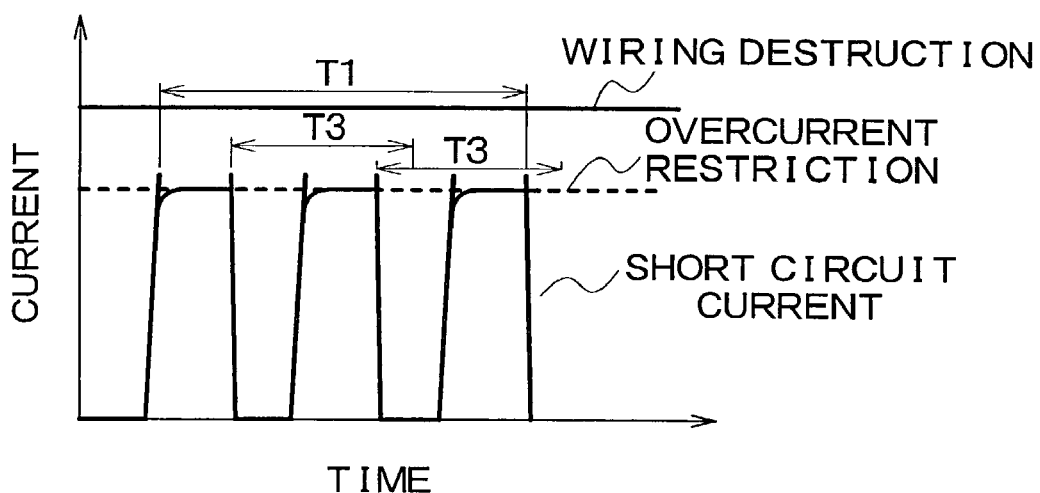
FIG. 6 is a graph showing wave shapes when the load driving device causes a short circuit when the load driving device is driven under PWM control according to the second embodiment.

Therefore, it is determined that the predetermined time T3 is shorter than the predetermined time T1 counted by the timer 17 but longer than a cycle of PWM control. In this way, as shown in FIG. 6, operation of the semiconductor 10 is stopped even if the current restriction detecting circuit 16 periodically outputs the current restriction detecting signal because the load current periodically exceeds the overcurrent restriction threshold under PWM control. Of cause, in PWM control, the operation of the semiconductor device 10 is stopped when the intermittent short circuit is repeatedly generated over the predetermined time T3 and the timer circuit 17 counts the predetermined time T1.

As mentioned above, in the load driving device shown in FIG. 4, it is possible to prevent the wiring from being destroyed due to an intermittent short circuit and short circuit generated during PWM control without causing improper operation of the load driving device.

In the second embodiment, the power on reset circuit 21 powers and resets the latch circuit 18, the timer circuit 17, the second latch circuit 22 and the second timer circuit 23. When the semiconductor device 10 is switched under PWM control, a signal for PWM control is input to the input circuit 11. Therefore, the power on reset circuit 21 outputs a power on reset signal only when a first rising edge of the signal from the input circuit 11 is detected, but thereafter does not output it even if the input circuit 11 periodically outputs the signal.

Third Embodiment

Figure 7:
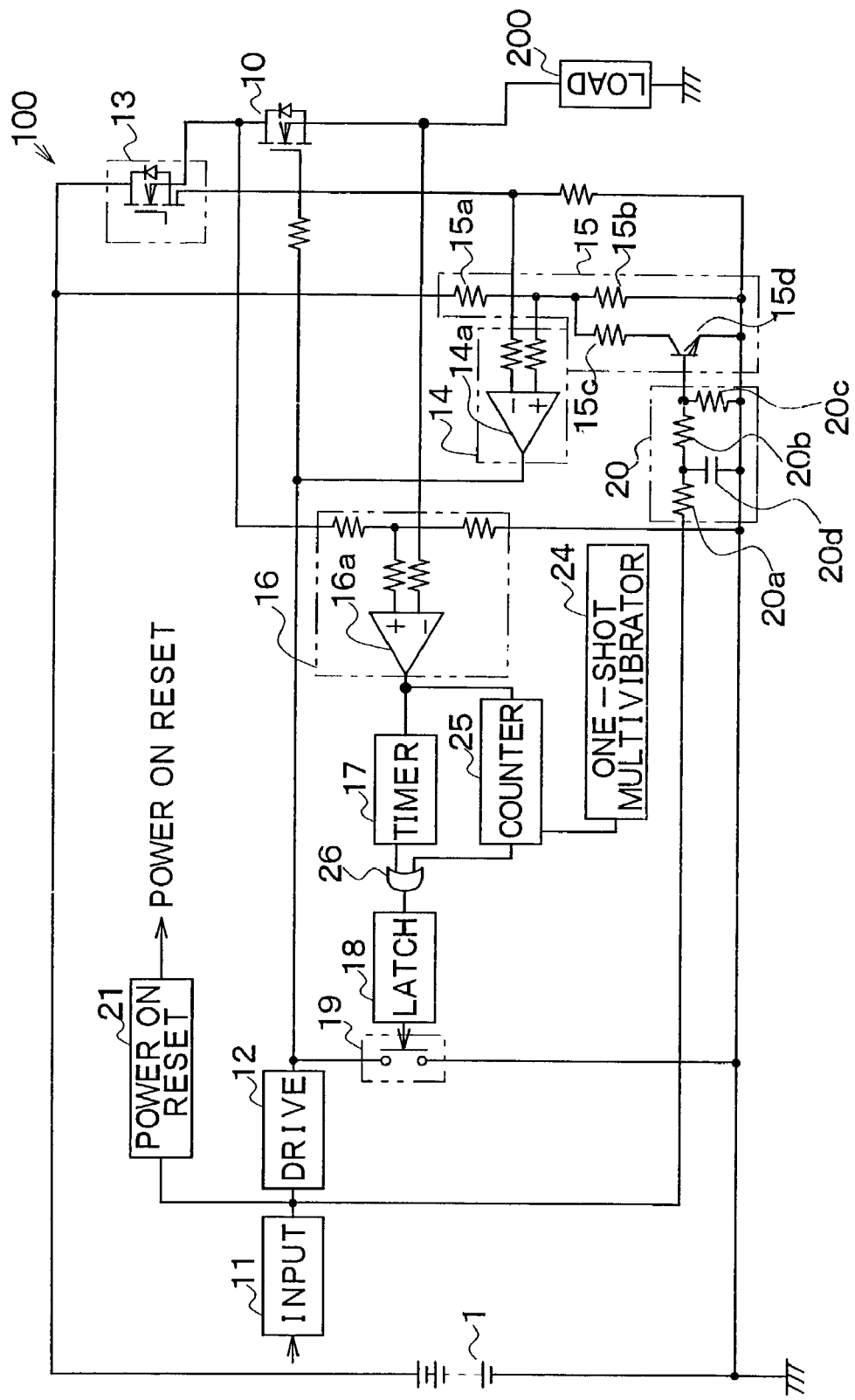
FIG. 7 shows a schematic view of a load driving device according to a third embodiment of the present invention.

A load driving device of a third embodiment of the present invention is described with reference to FIG. 7. In the load driving device 100 of the third embodiment, a one-shot multivibrator 24, a counter 25 and an OR circuit 26 are added to the load driving device 100 of the first embodiment.

According to the load driving device 100 of the present embodiment, the counter 25 counts the number of times that a current restriction detecting circuit 16 outputs a current restriction detecting signal while the one-shot multivibrator 24 generates a pulse with predetermined width. For example, the one-shot multivibrator 24 outputs the pulse upon occurrence of the first rising edge of the current restriction detecting signal. Then, the counter circuit 25 outputs an output block signal to the latch circuit 18 via the OR circuit 26 when the number counted by the counter 25 reaches a predetermined value. Therefore, it is possible to prevent the wiring from being destroyed due to the intermittent short circuit without improper operation of the load driving device.

In the third embodiment, the one-shot multivibrator 24 and the counter 25 form the intermittent short circuit detecting portion by counting number of the current restriction detecting signals in the predetermined time (i.e., a time equals the width of the pulse generated by the one-shot multivibrator). However, other configurations may alternatively be adapted as the intermittent short circuit detecting portion.

Figure 8:
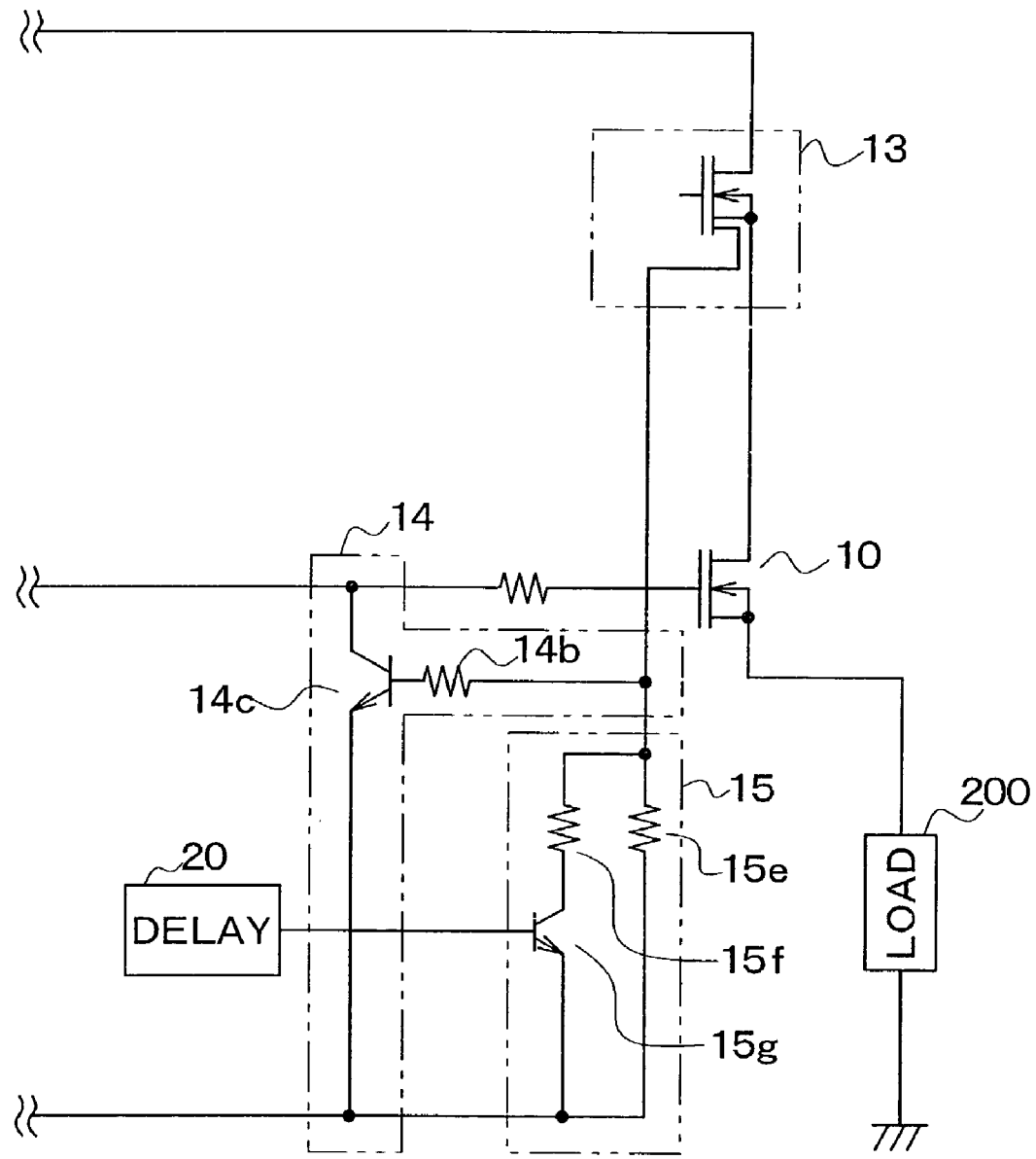
FIG. 8 shows a current restriction circuit and a threshold determination circuit according to a modification of a present invention.

Modification (1) In the first to third embodiments, the current restriction detecting circuit 14 and the threshold determination circuit 15 may alternatively be adapted to have the following construction as in FIG. 8. In FIG. 8, the current restriction circuit 14 includes a resistor 14b and a transistor 14c, and the threshold determination circuit 15 includes resistors 15e, 15f and a transistor 15g.

According to the load driving device 100 constructed as in FIG. 8, the threshold determination circuit 15 does not receive the delay signal from the delay circuit 20 until the predetermined time T2 passes after the load driving starts. The transistor 15g is OFF, and therefore a first threshold is defined as a resistance of the resistor 15e. The threshold determination circuit 15 receives the delay signal after the predetermined time T2 passes. The transistor 15g is ON, and therefore a second threshold is defined as a combined resistance of the resistors 15e, 15f.

A base voltage of the transistor 14c in the current restriction circuit 14 is defined based on a current flowing from the current mirror circuit 13 to the threshold determination circuit 15. The transistor 14c is OFF when the base voltage is under a predetermined voltage. However, when the base voltage exceeds the predetermined voltage because the load current is too large, the transistor 14c is ON and the semiconductor device 10 is OFF. Accordingly, because the load current decreases and therefore the base voltage of the transistor 14c decreases under the predetermined voltage, the transistor 14c is OFF and the semiconductor device is ON. Such operations are repeated and the load current is restricted to a level below the overcurrent restriction threshold.

(2) In the above mentioned embodiments, the predetermined time T1 may alternatively be adapted to have a variable value. For example, the predetermined time T1 after the predetermined time T2 passes may be longer than that until the predetermined time T2 passes after the load driving starts. For example, a first timer defines a relatively short time as time T1 before the delay circuit 20 outputs the delay signal, and a second timer defines a relatively long time that is longer than that defined by the first timer as the time T1 when the delay circuit 20 outputs the delay signal. That is, since the current restriction is executed based on lower current as the second threshold after the predetermined time T2 passes, the predetermined time T1 is defined as a longer time after the predetermined time T2 passes. Therefore, it is possible to stably drive the load 200 without immediately stopping operation of the semiconductor device 10.

Figure 9:
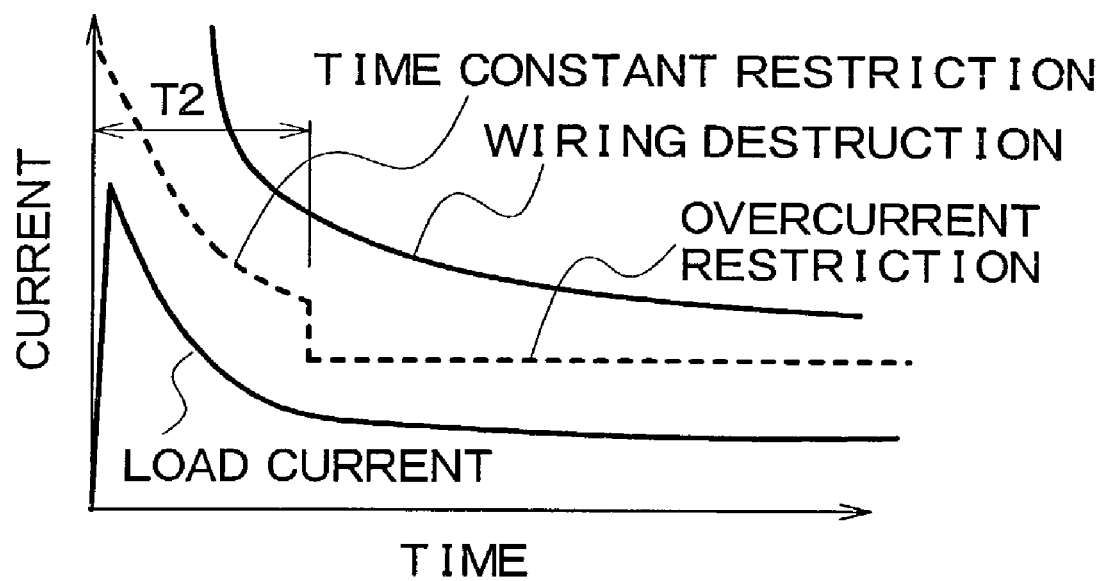
FIG. 9 is a graph of wave shapes when a first threshold is continuously changed according to a modification of a present invention.

(3) In the above mentioned embodiments, the first threshold of the overcurrent restriction threshold may continuously or stepwise decrease as in FIG. 9. For example, the first threshold is adjusted based on a time constant of the threshold determination circuit 15. Specifically, the resistor 15b in FIGS. 1, 4 and 7 or the resistor 15e in FIG. 8 is constructed by a variable resistor whose resistance varies with time. In this manner, a current restriction feature that matches rapidly changing current such as an incoming current of a lamp and the wiring destruction feature is obtained. Therefore, it is further possible to prevent the wiring from being destroyed by the intermittent short circuit without causing improper operation of the load driving device.

Figure 10:
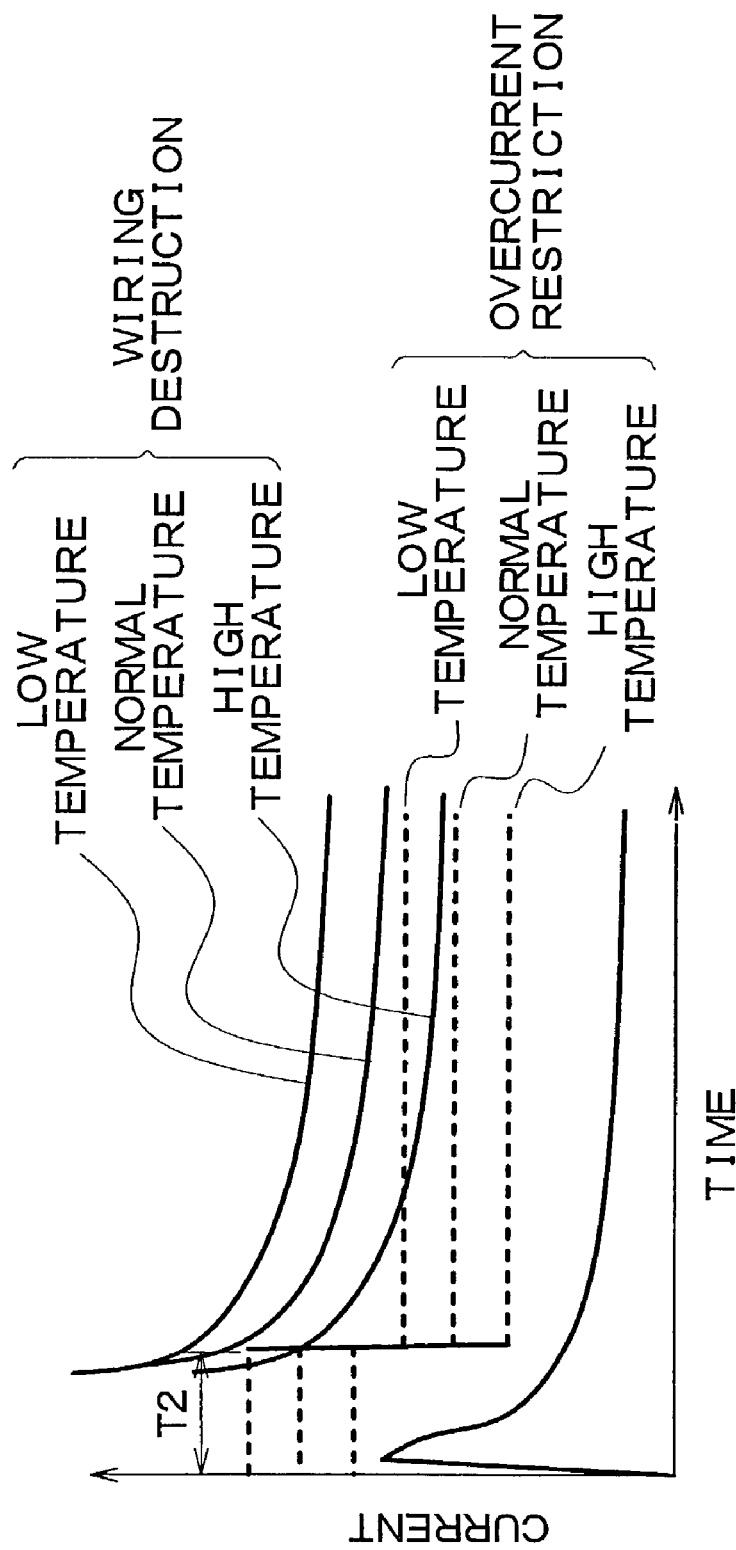
FIG. 10 is a graph of wave shapes when current restriction is in proportion to a wiring destruction temperature feature according to a modification of a present invention.

(4) The current restriction threshold may alternatively be proportional to the wiring destruction temperature feature as shown in FIG. 10. For example, when the load driving device 100 is formed on one chip, the resistors 15b, 15c in FIGS. 1, 4 and 7 and the resistors 15e, 15f in FIGS. 8 are formed as diffusion resistors. In this manner, the current restriction threshold is proportional to the wiring destruction temperature feature based on a temperature feature of the diffusion resistors. Otherwise, elements with a temperature feature such as zener diodes are directly connected to the resistors 15b, 15c or the resistors 15e, 15f. In this manner, the current restriction threshold is proportional to the wiring destruction temperature feature based on a temperature feature of the zener diodes. Therefore, it is further possible to prevent the wiring from being destroyed due to an intermittent short circuit without causing improper operation of the load driving device.

Figure 11:
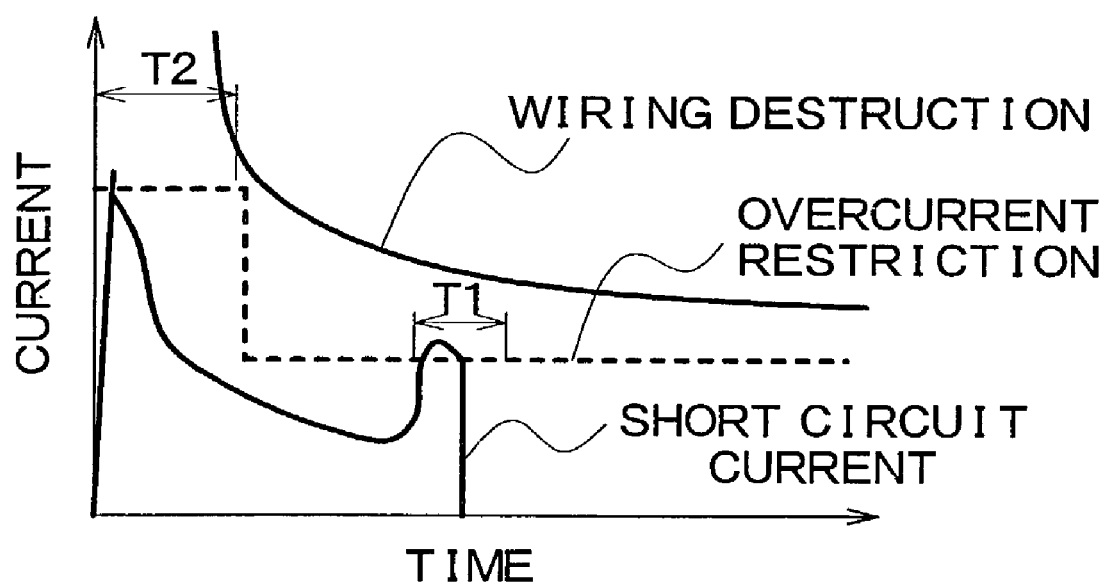
FIG. 11 is a graph showing a current feature when a semiconductor device with a temperature protection feature is used for driving a load according to a modification of a present invention.

(5) In the above mentioned embodiments, a semiconductor device with a temperature protection feature may alternatively be adapted as the semiconductor device 10. The semiconductor device with a temperature protection feature blocks an output thereof for preventing temperature destruction when a temperature thereof exceeds a predetermined value. In this case, as shown in FIG. 11, the semiconductor device 10 is OFF when the temperature is abnormally high even if the current restriction is not executed over the predetermined time T1. Therefore, it is possible to prevent the semiconductor device from being destroyed by high temperature. Incidentally, the semiconductor device 10 tends to generate heat due to the current restriction manner of the above mentioned embodiment. Accordingly, the semiconductor device with the temperature protection feature may be effectively used as the semiconductor device 10.

(6) In the above mentioned embodiments, the current mirror circuit 13 is used as a load current detecting device. However, the load current may alternatively be detected based on an ON-voltage of the semiconductor device 10. Also, the load current may alternatively be detected based on a voltage decrease of a resistor directly connected to a load current path. Further, the load current may alternatively be detected by a magnetic force generated around the load current path.

(7) In the above mentioned embodiments, the current restriction detecting circuit 16 observes the voltage between a source and drain of the semiconductor device 10 to detect the current restriction. However, the current restriction detecting circuit 16 may alternatively detect the current restriction by obtaining a signal, which is output when the current restriction is executed, from the current restriction circuit 14. In this case, a portion for obtaining the signal from the current restriction circuit 14 corresponds to current restriction detecting means.

(8) In the above mentioned embodiments, respective circuits in the load driving device 100 may alternatively include alternative elements so long as it performs the same function as the above-described respective circuits. For example, all or some of the respective circuits may be formed by means for performing each function such as a microcomputer.

(9) In the above mentioned embodiments, the load driving device 100 is a low side type that drives the load 200 at a low side of the electrical circuit. However, the load driving device 100 of a high side type that drives the load 200 at a high side of the electrical circuit may alternatively be adapted.

Application to a Vehicle

Next, the load driving device 100 may be applied to a vehicle as follows.

Figure 12:
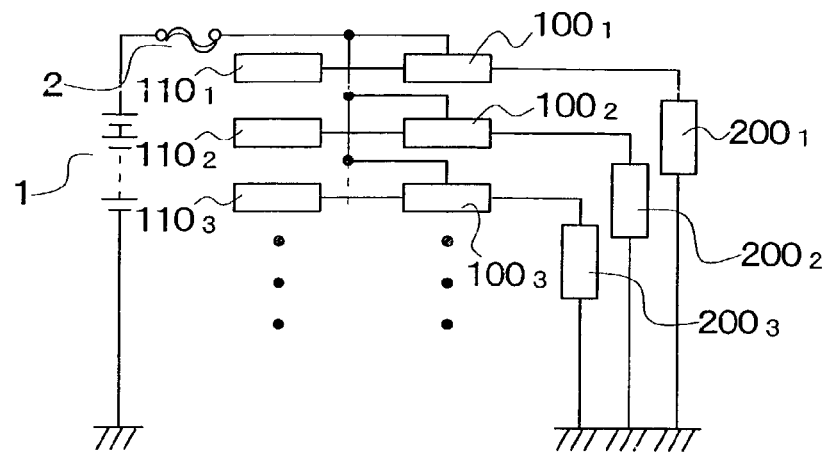
FIG. 12 shows a load driving device installed in a vehicle according to a modification of a present invention.

(1) Referring to FIG. 12, a battery 1 supplies electrical energy to respective electrical systems in a vehicle via a fusible link. Plural loads $200_1$, $200_2$, $200_3$ . . . to the vehicle are respectively driven by load driving devices $100_1$, $100_2$, $100_3$ . . . . One of the load driving devices 100 of the above mentioned embodiments is used for the load driving devices $100_1$, $100_2$, $100_3$ . . . . The load driving devices $100_1$, $100_2$, $100_3$ . . . are driven based on respective signals from load driving switches $110_1$, $110_2$, $110_3$ . . . . According to this example, the plural loads $200_1$, $200_2$, $200_3$ . . . are protected from overcurrent. Therefore, it is possible to reduce the number of fuses conventionally disposed between each load driving device and each load.

Figure 13:
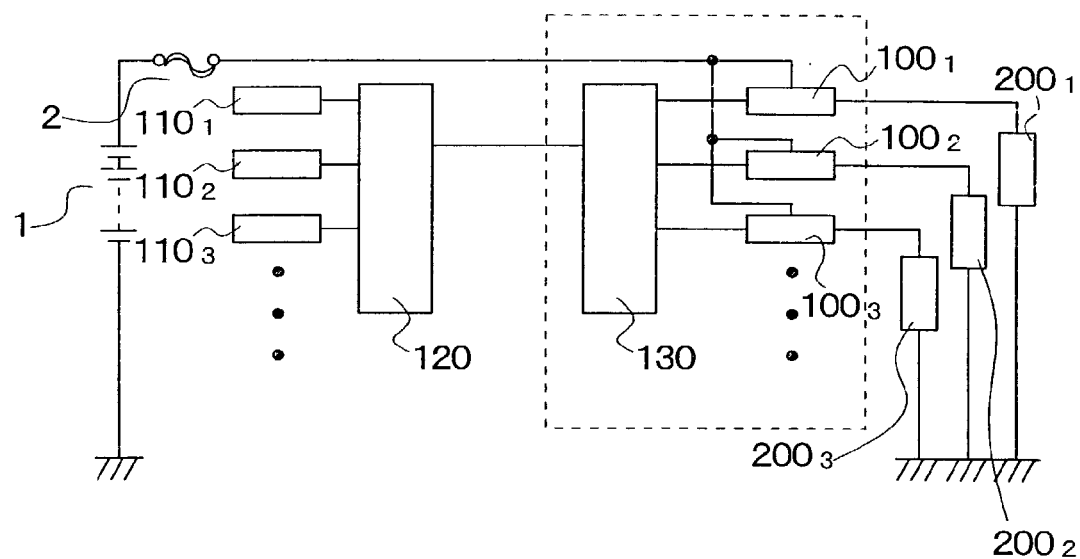
FIG. 13 shows a load driving device installed in a vehicle according to a modification of a present invention.

(2) Referring to FIG. 13, load driving devices $100_1$, $100_2$, $100_3$ . . . may alternatively be organized as one unit with a second control & communication device 130. A first control & communication device 120 transmits switch input signals from load driving switches $110_1$, $110_2$, $110_3$ . . . to the load driving devices $100_1$, $100_2$, $100_3$ . . . via the second control & communication device 130 by multiplex communication. In this construction, it is also possible to reduce the number of fuses conventionally disposed between each load driving device and each load. Incidentally, in this case, the second control & communication device 130 may diagnose malfunction of the load driving devices $100_1$, $100_2$, $100_3$ . . . .

Figure 14:
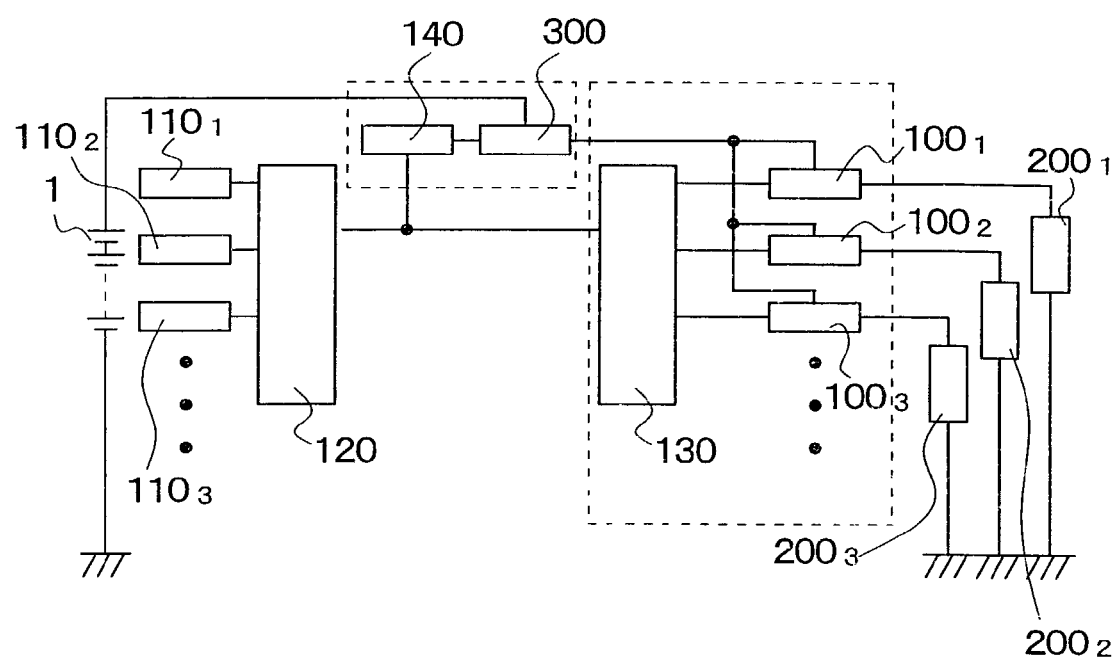
FIG. 14 shows a voltage resource device being applied instead of a fusible link according to a modification.

(3) Referring to FIG. 14, the fusible link 2 shown in FIG. 13 is not included. Generally, a fusible link is for protecting wiring that connects a battery to a load driving device from overcurrent. However, because the load driving device 100 mentioned in the first to third embodiments and modifications can protect the wiring from the overcurrent, the load driving device 100 is used as an electrical resource device 300 for protecting the wiring from overcurrent instead of the fusible link 2.

In this case, first and second control & communication devices 120, 130 are included, and the electrical resource device 300 obtains an indication signal for starting control from the first control & communication device 120 through a third control & communication device 140.

Incidentally, the electrical resource device 300 for protecting the wiring from overcurrent may alternatively be adapted to the example shown in FIG. 12 instead of the fusible link 2.

While the above description is of the preferred embodiments of the present invention, it should be appreciated that the invention may be modified, altered, or varied without deviating from the scope and fair meaning of the following claims.

What is claimed is:

1. An electrical resource device with overcurrent protection comprising:
    a semiconductor element for controlling a flow of current supplied by an electrical resource via wiring;
    a current detecting portion for detecting the current flowing in the wiring; and
    a current restriction portion for restricting the current to a level below a predetermined overcurrent restriction threshold while permitting the current to continue to flow by controlling the semiconductor element when the current detected by the current detecting portion exceeds the predetermined overcurrent restriction threshold; and
    a threshold determination portion for determining the overcurrent restriction threshold, the threshold determination portion including
        a threshold changing circuit for changing an overcurrent restriction threshold from a first threshold to a second threshold, and
        a delay circuit for outputting a delay signal to change the overcurrent restriction threshold from the first threshold to the second threshold,
    the threshold determination portion determining the first threshold as the overcurrent restriction threshold until the delay circuit outputs the delay signal to the threshold changing circuit when a second predetermined time (T2) elapses after the electrical resource device is operative, the second threshold being lower than the first threshold and becoming the overcurrent restriction threshold after the second predetermined time elapses;
    wherein the predetermined overcurrent restriction threshold is defined based on a relationship between time and a destruction current amount by which the wiring may be destroyed, and is determined to be under the destruction current.

2. The electrical resource device according to claim 1, further comprising:
    an output block portion for stopping operation of the semiconductor element when the current restriction portion executes the current restriction over a first predetermined time (T1).

3. The electrical resource device according to claim 2, wherein the output block portion includes a first timer portion for counting a time that the current restriction portion executes the current restriction and for outputting an output block signal when the time counted thereby exceeds the first predetermined time, a first latch portion for latching and outputting the output block signal from the first timer portion, and a control portion for stopping the operation of the semiconductor element based on an output signal from the latch portion.

4. The electrical resource device according to claim 1 wherein the threshold determination portion determines the first threshold so as to continuously or stepwise decrease.

5. The electrical resource device according to claim 1 wherein the threshold determination portion determines the first and the second thresholds based on a wiring destruction temperature feature of the wiring.

6. The electrical resource device according to claim 3 wherein the output block portion includes a current restriction detecting portion for detecting the current restriction by the current restriction portion and for outputting a current restriction detecting signal when the current restriction is executed, and
    wherein the first timer portion counts a time that the current restriction signal is output.

7. The electrical resource device according to claim 3 wherein the output block portion includes:
   a current restriction detecting portion for detecting the current restriction by the current restriction portion and for outputting a current restriction detecting signal when the current restriction is executed;
   a second latch portion for latching the current restriction detecting signal from the current restriction detection portion; and
   a second timer portion for counting a time that the current restriction detecting signal is not output from the current restriction detecting portion and for unlatching the second latch portion when the time counted thereby exceeds a third predetermined time (T3) that is shorter than the first predetermined time,
   wherein the first timer portion counts a time that the current restriction signal is latched by the second latch portion.

8. The electrical resource device according to claim 6 wherein the output block portion includes an intermittent short circuit detecting portion for detecting an intermittent short circuit and for outputting another output block signal when the intermittent short circuit is detected, wherein the intermittent short circuit detecting portion counts a number of the current restriction detecting signals and detects the intermittent short circuit when the number counted thereby exceeds a predetermined value within a predetermined term, and
   the another output block signal of the intermittent short detecting portion and the output block signal of the first timer portion being input to the first latch portion.

9. The electrical resource device according to claim 8 wherein the intermittent short circuit detecting portion includes a one-shot multivibrator for determining the predetermined term and a counter for counting the number of the current restriction detecting signals.

10. The electrical resource device according to claim 9 wherein the one-shot multivibrator determines the predetermined term from detection of a rising edge of the current restriction detecting signal.

11. The electrical resource device according to claim 8, further comprising:
   an OR circuit for inputting a signal defined based on the another output block signal of the intermittent short detecting portion and the output block signal of the first timer portion and for outputting an output block signal when at least one of the signals is inputted.

12. The electrical resource device according to claim 1 wherein the semiconductor element includes a semiconductor element with a temperature protection function for stopping operation thereof based on its temperature.

13. The electrical resource device according to claim 1 wherein the electrical resource device is located between a vehicle battery and a load driving device for protecting wiring from the vehicle battery and the load driving device.

14. A load driving device for supplying load current to a load via wiring comprising:
   a semiconductor element for controlling the load current to the load;
   a current detecting portion for detecting the load current flowing through the wiring;
   a current restriction portion for restricting the current to a level below a predetermined overcurrent restriction threshold while permitting the current to continue to flow by controlling the semiconductor element when the current detected by the current detecting portion exceeds the predetermined overcurrent restriction threshold, wherein the predetermined overcurrent restriction threshold is defined based on a relationship between time and a change of a destruction current amount by which the wiring may be destroyed, and is determined to be under the destruction current to prevent the load current from ever reaching the destruction current;
   a current restriction detecting portion for detecting the current restriction by the current restriction portion and for outputting a current restriction detecting signal when the current restriction portion executes the current restriction; and
   an output block portion for counting time elapsed since the current restriction detecting signal has been output and for stopping operation of the semiconductor element when the current restriction portion executes the current restriction over a first predetermined time (T1);
   wherein the output block portion continues the counting when the current restriction detecting signal is intermittently output within a second predetermined time (T3), which is shorter than the first predetermined time, by an intermittent short circuit of the wiring.

15. A load driving device for supplying load current to a load via wiring comprising:
   a semiconductor element for controlling the load current to the load;
   a current detecting portion for detecting the load current flowing through the wiring;
   a current restriction portion for restricting the current to a level under a predetermined overcurrent restriction threshold by controlling the semiconductor element when the current detected by the current detecting portion exceeds the predetermined overcurrent restriction threshold, wherein the predetermined overcurrent restriction threshold is defined based on a relationship between time and a change of a destruction current amount by which the wiring may be destroyed, and is determined to be under the destruction current;
   a current restriction detecting portion for detecting the current restriction by the current restriction portion and for outputting a current restriction detecting signal when the current restriction portion executes the current restriction;
   a first latch portion for latching and outputting the current restriction detecting signal from the current restriction detecting portion;
   a first timer portion for counting a time that the current restriction detecting signal is not output from the current restriction detecting portion and for unlatching the second latch portion when the time counted thereby exceeds a first predetermined time (T3) that is longer than a generation cycle of an intermittent short circuit;
   a second timer portion for counting a time that the current restriction signal is output from the first latch portion and for outputting an output block signal when the time counted thereby exceeds a second predetermined time (T2) longer than the first predetermined time;
   a second latch portion for latching the output block signal from the second timer portion; and
   a stopping portion for stopping operation of the semiconductor element based on the output of the second latch portion.

16. A load driving device for supplying load current to a load via wiring by controlling a semiconductor element with PWM control comprising:
   a current detecting portion for detecting the current flowing through the wiring;

a current restriction portion for restricting the current to a level under a predetermined overcurrent restriction threshold by controlling the semiconductor element when the current detected by the current detecting portion exceeds the predetermined overcurrent restriction threshold, wherein the predetermined overcurrent restriction threshold is defined based on a relationship between time and a change of destruction current amount by which the wiring may be destroyed, and is determined to be under the destruction current;

a current restriction detecting portion for detecting the current restriction by the current restriction portion and for outputting a current restriction detecting signal when the current restriction portion executes the current restriction;

a stopping portion for counting a time since the current restriction detecting signal is output and for stopping operation of the semiconductor element when the time counted thereby exceeds a first predetermined time (T1); and wherein the stopping portion continues the counting when the current restriction detecting signal is periodically output within a second predetermined time (T3), which is shorter than the first predetermined time and longer than a cycle of PWM control, by an intermittent short circuit of the wiring.

17. A load driving device for supplying load current to a load via wiring by controlling a semiconductor element with PWM control comprising:

a current detecting portion for detecting the load current flowing through the wiring;

a current restriction portion for restricting the current under a predetermined overcurrent restriction threshold by controlling the semiconductor element when the current detected by the current detecting portion exceeds the predetermined overcurrent restriction threshold, wherein the predetermined overcurrent restriction threshold is defined based on a relationship between time and a change of destruction current amount by which the wiring may be destroyed, and is determined to be under the destruction current;

a current restriction detecting portion for detecting the current restriction by the current restriction portion and for outputting a current restriction detecting signal when the current restriction is executed;

a first latch portion for latching and outputting the current restriction detecting signal from the current restriction detecting portion;

a first timer portion for counting a time that the current restriction detecting signal is not output from the current restriction detecting portion and for unlatching the second latch portion when the time counted thereby exceeds a first predetermined time (T3) that is longer than a cycle of PWM control;

a second timer portion for counting a time that the current restriction signal is output from the first latch portion and for outputting an output block signal when the time counted thereby exceeds a second predetermined time (T1) longer than the first predetermined time;

a second latch portion for latching the output block signal from the second timer portion; and a stopping portion for stopping operation of the semiconductor element based on the output of the second latch portion.

18. A load driving device for supplying load current to a load via wiring comprising:

a semiconductor element for controlling the load current to the load;

a current detecting portion for detecting the current flowing through the wiring;

a current restriction portion for restricting the current to a level under a predetermined overcurrent restriction threshold while permitting the current to continue to flow by controlling the semiconductor element when the current detected by the current detecting portion exceeds the predetermined overcurrent restriction threshold, wherein the predetermined overcurrent restriction threshold is defined based on a relationship between time and a change of a destruction current amount by which the wiring may be destroyed, and is determined to be under the destruction current to prevent the load current from ever reaching the destruction current;

a current restriction detecting portion for detecting the current restriction by the current restriction portion and for outputting a current restriction detecting signal when the current restriction is executed;

a first timer portion for counting a time that the current restriction detecting signal is not output from the current restriction detecting portion and for outputting an output block signal when the time counted thereby exceeds a predetermined time (T1);

an intermittent short circuit detecting portion for detecting an intermittent short circuit and for outputting another output block signal when the intermittent short circuit is detected, wherein the intermittent short circuit detecting portion counts a number of the current restriction detecting signals and determines the intermittent short circuit when the number counted thereby exceeds a predetermined value within a predetermined term; and a stopping portion for stopping operation of the semiconductor element when the output block signal is output from at least one of the timer portion and the intermittent short circuit detecting portion.

19. The electrical resource device according to claim 1, wherein the predetermined overcurrent restriction threshold is determined to be under the destruction current to prevent the load current from ever reaching the destruction current.

* * * * *